(12) United States Patent　　(10) Patent No.: US 7,805,219 B2
Ishikawa et al.　　(45) Date of Patent: Sep. 28, 2010

(54) CARRIER ROBOT SYSTEM AND CONTROL METHOD FOR CARRIER ROBOT

(75) Inventors: Shinichi Ishikawa, Fukuoka (JP); Hitoshi Wakizako, Fukuoka (JP); Kazunari Shiraishi, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 1066 days.

(21) Appl. No.: 10/521,572

(22) PCT Filed: May 15, 2003

(86) PCT No.: PCT/JP03/06085

§ 371 (c)(1), (2), (4) Date: Aug. 16, 2005

(87) PCT Pub. No.: WO2004/007150

PCT Pub. Date: Jan. 22, 2004

(65) Prior Publication Data

US 2006/0106497 A1　　May 18, 2006

(30) Foreign Application Priority Data

Jul. 17, 2002　(JP) ............................. 2002-207675

(51) Int. Cl.
*G06F 19/00* (2006.01)
*G06F 7/00* (2006.01)
*H02P 3/00* (2006.01)

(52) U.S. Cl. ................ 700/245; 700/213; 700/218; 700/259; 318/328; 318/323.06; 318/323.08

(58) Field of Classification Search ................ 700/245, 700/213, 218, 259; 318/328, 323.06, 323.08; 219/121.68, 121.74; 422/63, 65, 67; 436/43, 436/47, 48; 427/428; 33/286; 702/94; 118/300, 118/730, 719

See application file for complete search history.

(56) References Cited

U.S. PATENT DOCUMENTS 4,380,696 A * 4/1983 Masaki .................. 219/124.34

(Continued)

FOREIGN PATENT DOCUMENTS

JP　　2-160499 A　　6/1990

(Continued)

OTHER PUBLICATIONS

Gräser, Technological Solutions to Autonomous Robot Control, 1998, Internet, p. 1-7.*

(Continued)

*Primary Examiner*—Khoi Tran
*Assistant Examiner*—Ian Jen
(74) *Attorney, Agent, or Firm*—Sughrue Mion, PLLC (57) ABSTRACT

A carrier robot system and a control method for a carrier robot enabling teaching even when an operator cannot approach a teaching position for wafer conveyance are provided. In a carrier robot system comprising a robot which has a placement portion for placing an object presenting a low-profile form thereon and carries the object and a robot controller for controlling the robot, a jig mounted on the placement portion of the robot and having an image pickup member, an image processing portion for processing an image picked up by the image pickup member, and a superior control portion for controlling the robot controller and image processing portion from a superior position are provided.

4 Claims, 8 Drawing Sheets

U.S. PATENT DOCUMENTS

| | | | |
|---|---|---|---|
| 4,453,085 A * | 6/1984 | Pryor | 250/203.1 |
| 4,483,407 A * | 11/1984 | Iwamoto et al. | 180/9.5 |
| 4,613,942 A * | 9/1986 | Chen | 700/259 |
| 4,636,137 A * | 1/1987 | Lemelson | 414/730 |
| 4,698,775 A * | 10/1987 | Koch et al. | 700/218 |
| 4,753,569 A * | 6/1988 | Pryor | 700/250 |
| 4,853,771 A * | 8/1989 | Witriol et al. | 348/94 |
| 5,219,264 A | 6/1993 | McClure et al. | |
| 6,433,463 B1 * | 8/2002 | Lal et al. | 310/328 |
| 6,921,466 B2 * | 7/2005 | Hongo et al. | 204/198 |
| 2002/0006876 A1 * | 1/2002 | Hongo et al. | 505/191 |
| 2003/0110649 A1 * | 6/2003 | Hudgens et al. | 33/286 |

FOREIGN PATENT DOCUMENTS

| | | |
|---|---|---|
| JP | 10-89943 A | 4/1998 |
| JP | 10-91225 A | 4/1998 |
| JP | 2002-2909 A | 1/2002 |
| JP | 2002-18754 A | 1/2002 |

OTHER PUBLICATIONS

Japanese Office Action dated Sep. 16, 2008.

* cited by examiner

CARRIER ROBOT SYSTEM AND CONTROL METHOD FOR CARRIER ROBOT

TECHNICAL FIELD

The present invention relates to a carrier robot for carrying out a wafer or the like presenting a low-profile form placed at a predetermined placement position or carrying in a wafer or the like presenting a low-profile form to a predetermined position, and in particular, it relates to a carrier robot system and a control method for a carrier robot.

BACKGROUND ART

In a wafer carrier device, it is necessary that a robot correctly carries a wafer to a predetermined position within a processing unit to prevent failures such as wafer drops and incorrect processings. However, owing to various reasons such as dimensional errors of components composing the device, assembly errors of the device and the like, in actuality, a wafer is not correctly carried to a predetermined position even if the carrier robot is shifted to a position of the design value. Accordingly, a teaching operation of the carrier robot is required prior to operating the carrier device.

In conventional carrier robot teaching methods, without necessitating high-order skills of an operator, for the purpose of swiftly carrying out a teaching operation with a fixed accuracy at all times, a teaching method for a transfer unit of a semiconductor manufacturing apparatus has been described in the Unexamined Japanese Patent Application Publication No. Hei09-102527. Hereinafter, this is briefly described by use of the drawings.

Figure 8:
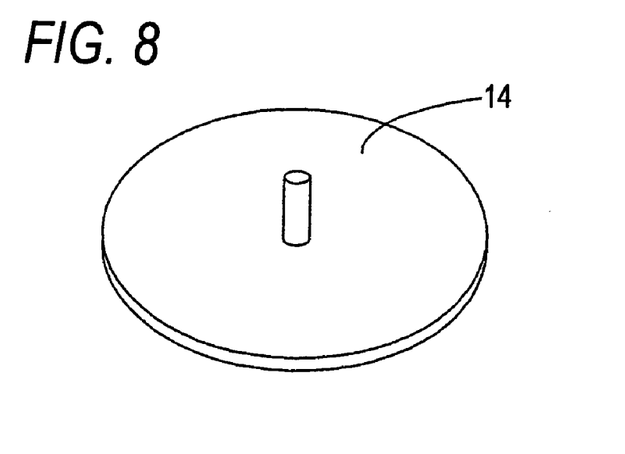
FIG. 8 is a perspective view showing a jig according to the prior art.
Figure 9:
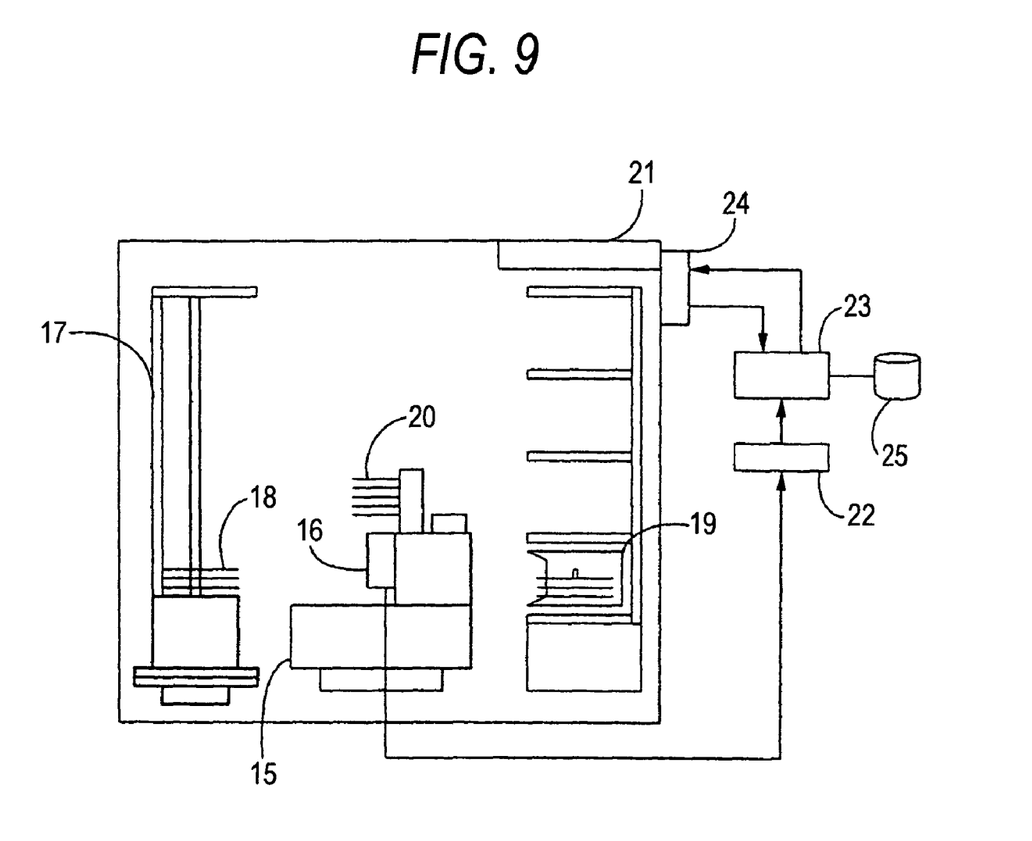
FIG. 9 is a constructional diagram showing a semiconductor manufacturing apparatus according to the prior art.

In FIG. 8, reference numeral 14 denotes a jig composed of a circular plate having an identical form and size to that of a wafer and a columnar pin provided in a standing condition at a center position thereof. In FIG. 9, a detecting member 16 is provided at a front surface portion of a transfer unit 15 for carrying a wafer, and this is a detecting member for optically detecting a position of the jig 14. In the above construction, while installing the transfer unit 15 at its home position, an operator detects, by the detecting member 16, the circular plate portion and pin of the jig 14 filled by insertion into a boat 17 and obtains positions in the X-axis direction, Y-axis direction, and Z-axis direction of the jig 14 with reference to the transfer unit 15.

In the teaching method for a transfer unit of a semiconductor manufacturing apparatus as in the above, position data of the transfer unit 15 for filling a wafer by insertion into the boat 17 can be obtained.

However, in recent semiconductor manufacturing apparatuses, with the advancement of high density, operational space of the transfer unit has been narrowed, and it has become difficult to carry out correct teaching of the transfer unit, and in teaching, even teaching jigs cannot be utilized.

DISCLOSURE OF THE INVENTION

Accordingly, an object of the present invention is to provide a carrier robot system and a control method for a carrier robot enabling teaching even when an operator cannot approach a teaching position for wafer conveyance.

In order to solve the above problems, a carrier robot system according to claim 1 is characterized, in a carrier robot system comprising a robot which has a placement portion for placing an object presenting a low-profile form thereon and carries the object and a robot controller for controlling the robot, in that a jig positioned in a predetermined direction and mounted on the placement portion of the robot and having an image pickup member; an image processing portion for processing an image picked up by the image pickup member; and a superior control portion for controlling the robot controller and image processing portion from a superior position are provided.

According to the carrier robot system according to claim 1, teaching becomes possible even when an operator cannot approach a teaching position for conveyance of a wafer or the like.

A control method for a carrier robot according to claim 2 is characterized, in a control method for a carrier robot for carrying an object presenting a low-profile shape placed at a predetermined placement position, in that a jig having an image pickup member is positioned in a predetermined direction and placed in advance on a placement portion of a front end of an arm of the robot, the robot is shifted to a position where the image pickup member can detect a characteristic part existing in the vicinity of the predetermined placement position, an image including the characteristic part is picked up by the image pickup member, a position of the characteristic part in a coordinate system of the image pickup member is determined based on the picked-up image, and a position on the coordinate system of the image pickup member is transformed into a position on a coordinate system of the robot to determine the placement position.

According to the control method for a carrier robot according to claim 2, teaching can be carried out even when an operator cannot approach a teaching position for conveyance of a wafer or the like, whereby a substantial time reduction and labor savings of a teaching operation can be realized.

A control method for a carrier robot according to claim 3 is characterized in that a transformation matrix for transforming a relationship between the coordinate system of the image pickup member and the coordinate system of the robot in translation and rotation is determined in advance, and the position of the characteristic part in the coordinate system of the image pickup member is transformed into a position in the coordinate system of the robot.

According to the control method for a carrier robot according to claim 3, a teaching position of the carrier robot can be obtained by detecting a position of the characteristic part by the image pickup member.

A control method for a carrier robot according to claim 4 is characterized in that the jig is removable from the placement portion during conveyance of the object presenting a low-profile form.

According to the control method for a carrier robot according to claim 4, the jig can be shared by a plurality of carrier robots, whereby maintenance costs can be reduced.

A control method for a carrier robot according to claim 5 is characterized in that a characteristic part such as a hole, a pin, a mark, a letter pattern or the like is provided in the vicinity of the placement position.

According to the control method for a carrier robot according to claim 5, various objects in the vicinity of the placement position can be utilized as a characteristic part.

BEST MODE FOR CARRYING OUT THE INVENTION

Hereinafter, a control method for a carrier robot according to a first embodiment of the present invention will be described on the basis of drawings.

A processing concerning detection of a placement position of a wafer or the like will be shown below as an example where, by detecting a height to place an object presenting a low-profile form such as a wafer by use of a noncontact sensor provided at the front end of an unillustrated hand, a teaching position in the height direction has already been determined.

Figure 1:
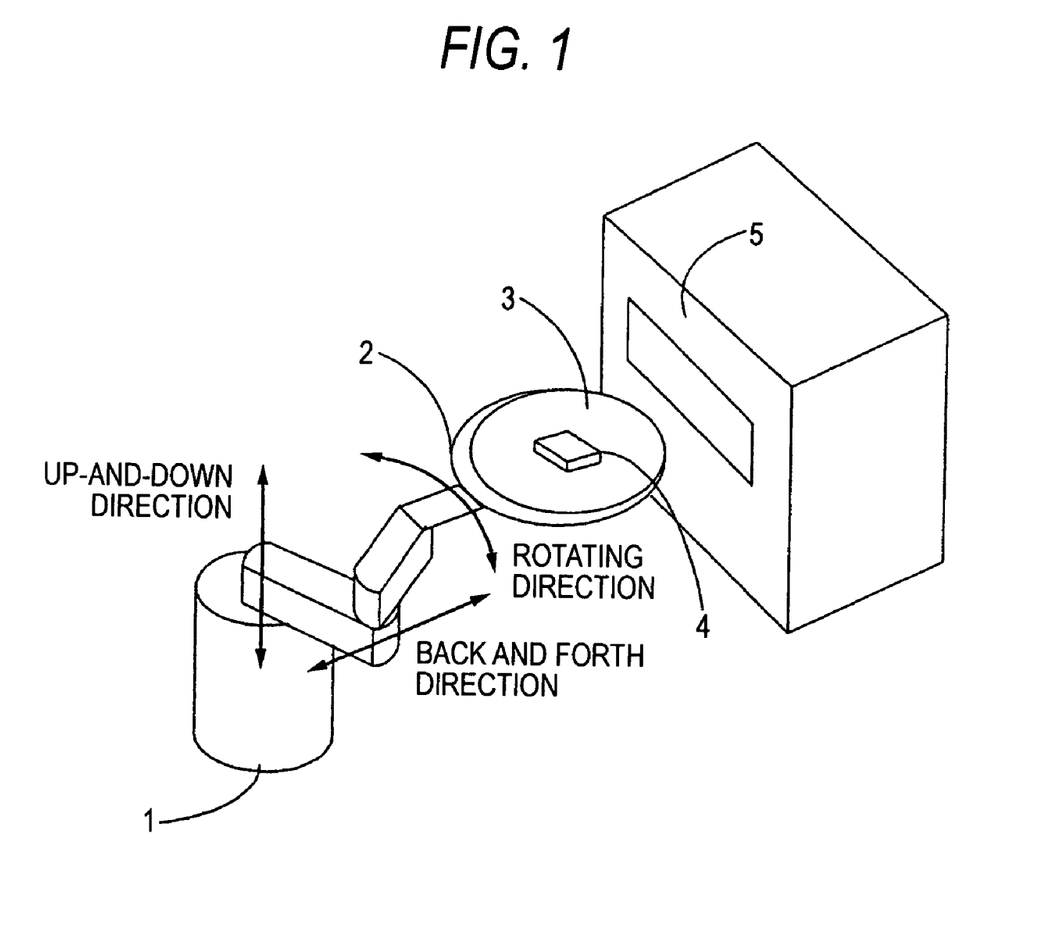
FIG. 1 is a perspective view of a wafer carrier device showing an embodiment of the present invention.

FIG. 1 is a view of a wafer carrier device showing an embodiment of the present invention. In FIG. 1, reference numeral 1 denotes a wafer carrier robot, at whose front end, a hand 2 for placing a wafer is attached. The wafer carrier robot 1 has an arm with three degrees of freedom in total of an axis for rotating the hand 2 around the vertical axis, an axis for retracting the same in the back and forth direction, and an axis for elevating the same in the up-and-down direction, and normally, this inserts the hand 2 into a processing unit 5 to be a wafer carrying-in/out target and performs a wafer carrying in/out operation. Reference numeral 3 denotes a teaching jig placed on the hand 2 in place of a wafer. The teaching jig 3 is placed on the hand 2 only during teaching and is removed from the hand 2 during normal wafer conveyance. In addition, the teaching jig 3 has an arc identical in diameter to a wafer so as to be arranged, when placed on the hand 2, similarly to a wafer. Furthermore, although unillustrated, the teaching jig 3 has a positioning mechanism so as to be always oriented in a fixed direction when placed on the hand 2, and the position is within a fixed range of tolerance when this is placed on the hand 2 again. Reference numeral 4 denotes a camera provided as an image pickup member, which is installed so as to shoot the downside of the teaching jig 3. The camera 4 is desirably as small-sized and lightweight as possible. The camera 4 is installed in the center of the teaching jig 3.

Figure 2:
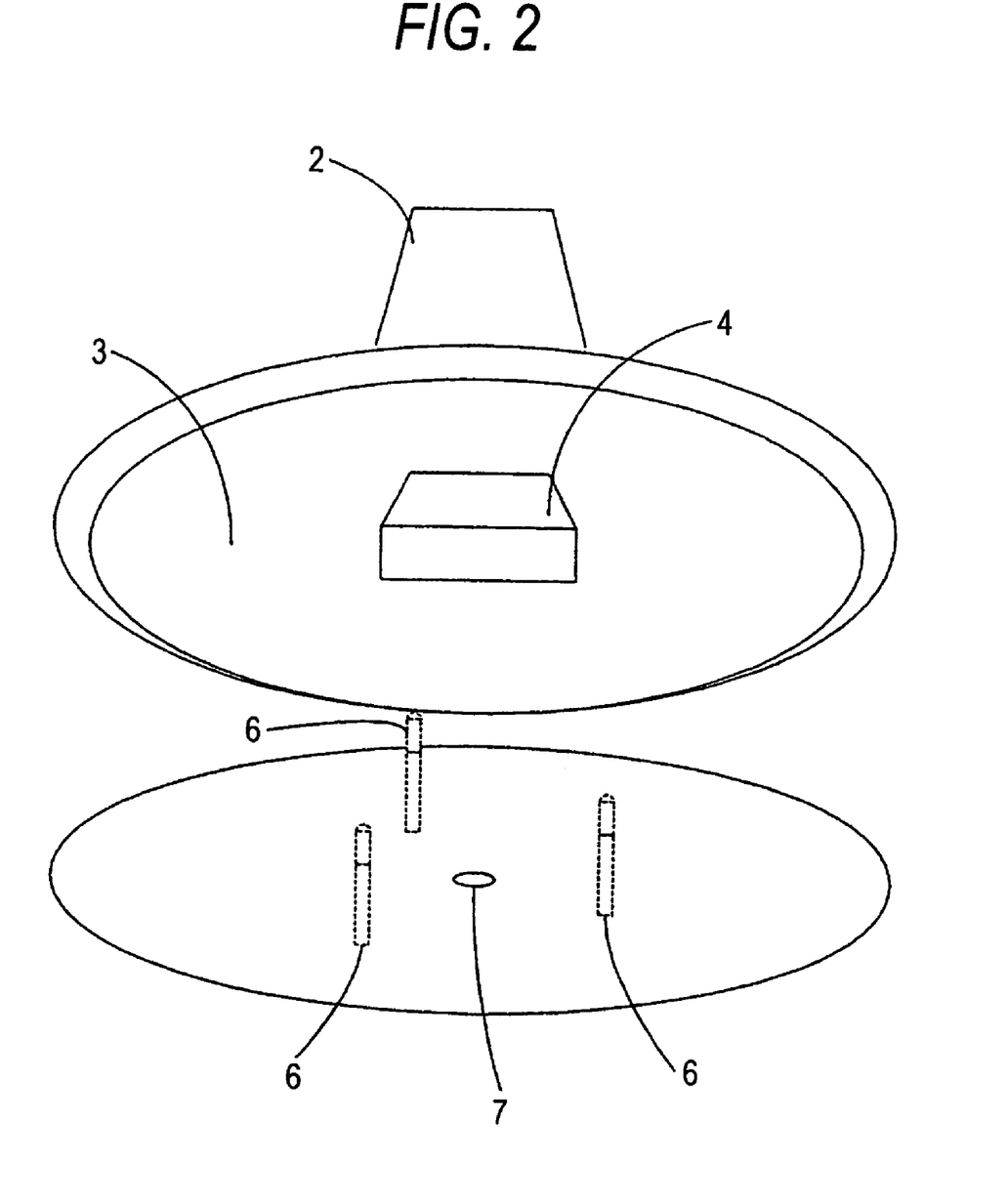
FIG. 2 is a perspective view of a hand portion and the inside of a processing unit showing an embodiment of the present invention.

FIG. 2 is a view of the hand 2 inserted in the processing unit 5. Although wafer placement positions in processing units can have various forms, description will be given of an example where a hole and three pins exist at a site to place a wafer, as one of the examples.

Three pins 6 move up and down, and when a wafer is placed, the pins are raised, while these have been lowered during a teaching operation. Reference numeral 7 denotes a hole, which is a positioning mark to be a characteristic position during a teaching operation.

In this embodiment, although this positioning mark 7 is a hole present at a position equally distant from each of the three pins 6, as long as a geometrical form or pattern, such as a cross mark, a circular mark, a letter pattern or the like, which can be clearly distinguished from its peripheral part exists, the present embodiment can be carried out.

By the positioning mechanism of the teaching jig 3 with respect to the hand 2 and the arrangement of the camera 4 centered in the teaching jig 3, origins and directions of a coordinate system of the camera 4 and a user coordinate system at the center of the hand 2 can be made coincident.

Herein, the user coordinate system means coordinates defined on the basis of at least three arbitrary points (origin O, X-direction defining point XX, Y-direction defining point XY) on a robot coordinate system.

Therefore, when the hand 2 on which the teaching jig 3 has been placed is correctly positioned at a predetermined placement position, the positioning mark 7 is seen in the center of a field of vision of the camera 4.

As a result that the relationship between the coordinate system of the camera and coordinate system of the carrier robot is already known as such, a relationship between an objective position and a present position of the carrier robot can be acquired based on the position of a characteristic part viewed from the camera 4.

Figure 3:
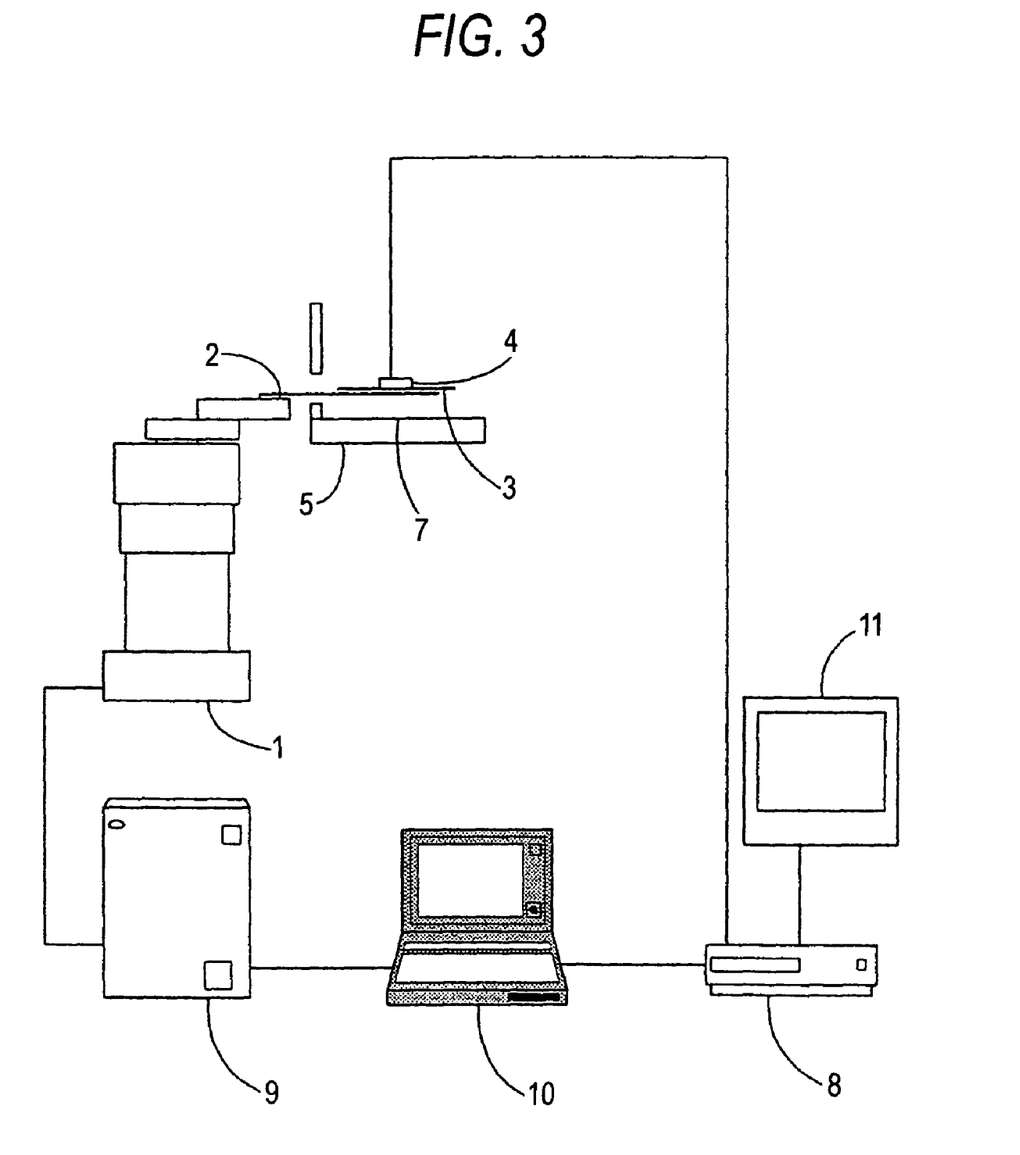
FIG. 3 is a constructional diagram showing an overall construction of an embodiment of the present invention.
Figure 4:
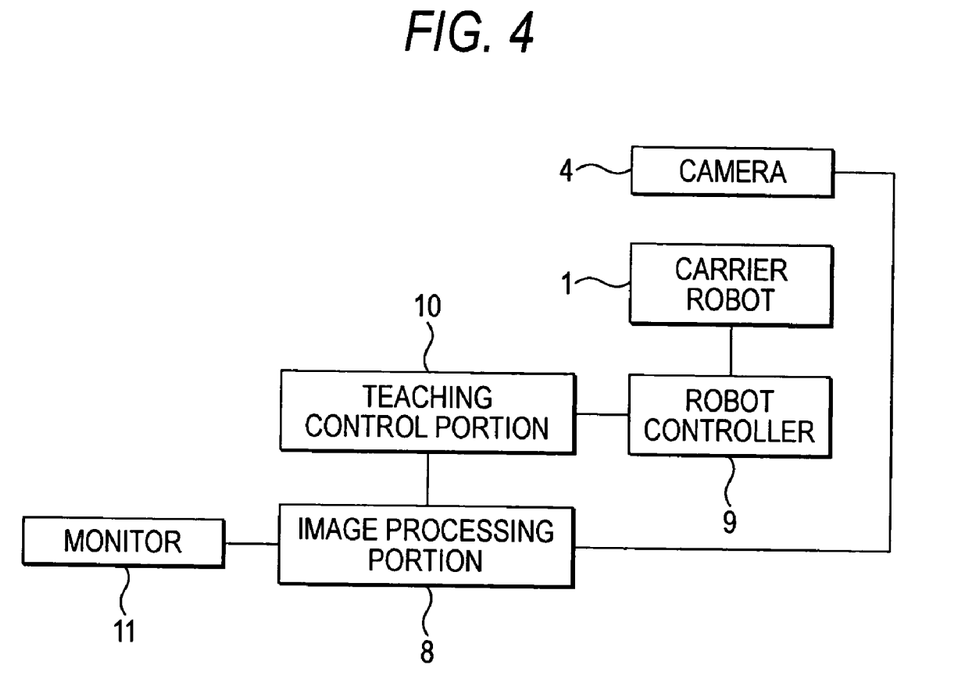
FIG. 4 is a block diagram showing an overall construction of an embodiment of the present invention.

FIG. 3 is a schematic diagram showing an overall construction of an embodiment of the present invention, and FIG. 4 is a block diagram showing the overall construction. In FIG. 3 and FIG. 4, reference numeral 8 denotes an image processing portion to process an image from the camera 4, reference numeral 9 denotes a robot controller to cause the wafer carrier robot 1 action, reference numeral 10 denotes a teaching control portion to output an instruction to the image processing portion 8 and robot controller 9, and reference numeral 11 denotes a monitor. In addition, the construction includes the aforementioned wafer carrier robot 1, hand 2, teaching jig 3, and camera 4 installed in the center of the teaching jig 3.

The camera 4 is connected to the image processing portion 8. The image processing portion 8 can, upon receiving an instruction from the teaching control portion 10, extract the positioning mark 7 within the processing unit 5 from a picture of the camera 4 mounted on the teaching jig 3 positioned on the hand 2 by a program stored in its inside in advance, calculates a shift amount from a present position of the camera 4 to be positioned directly above the positioning mark 7, and outputs the information to the teaching control portion 10.

The teaching control portion 10 calculates positional data of the respective axes of the wafer carrier robot 1 based on this information and outputs an instruction to the robot controller 9 to actuate the wafer carrier robot 1. Herein, although the teaching control portion 10 has been provided separately from the robot controller 9, this may be inside the unit of the robot controller 9.

Since teaching in the height direction has already been completed in the present embodiment, a distance in the height direction between the camera and positioning mark is already known. Therefore, a ratio indicating to what length one pixel of a camera image corresponds on the surface where the positioning mark exists can also be known in advance. Here, although the position of the wafer carrier robot 1 can be directly determined by detecting a position of the positioning mark 7, herein, description will be given according to a flowchart shown in FIG. 5 of an example where a correcting amount is calculated based on an initially taught position and an instruction is outputted to the robot controller 9.

Figure 5:
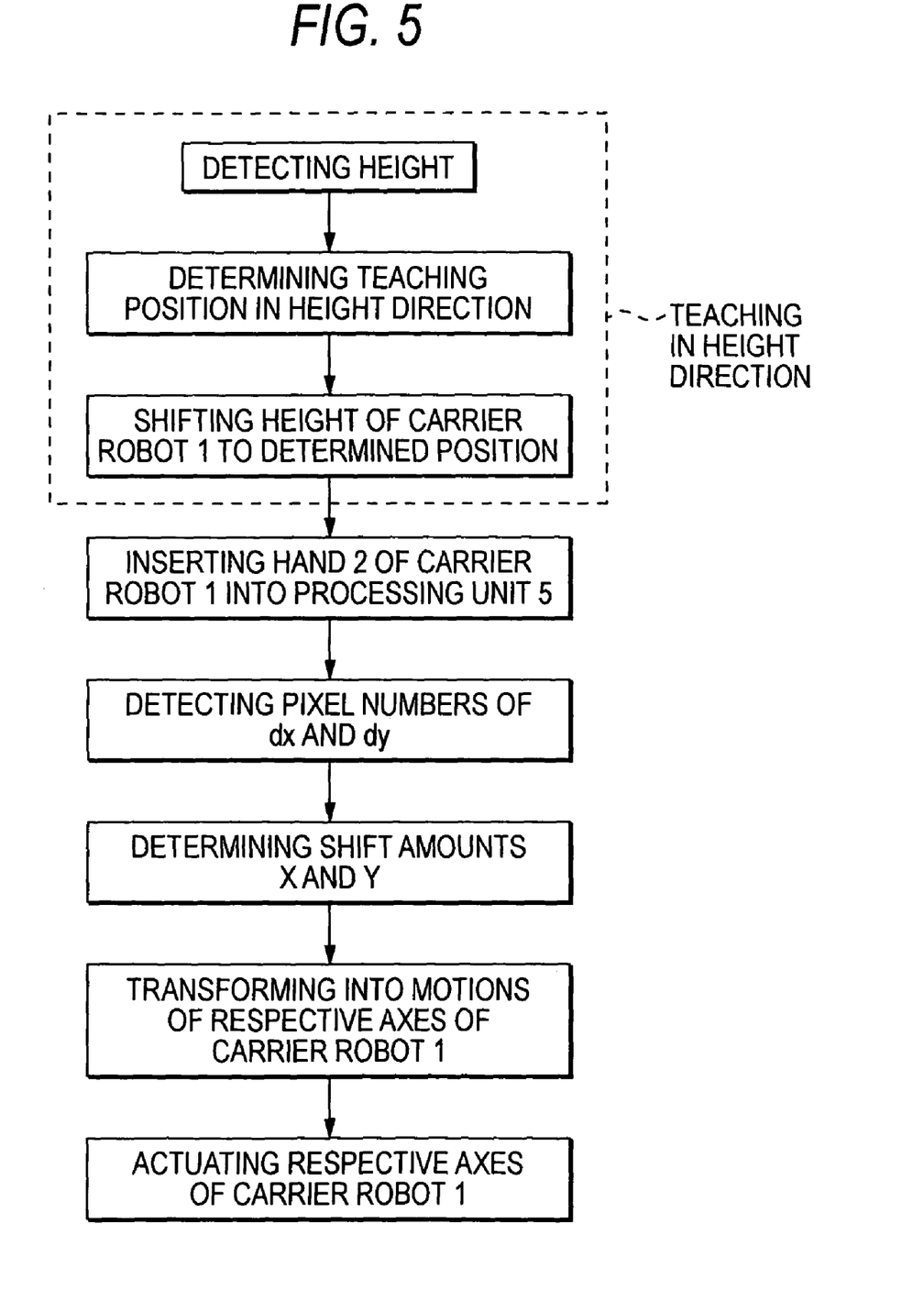
FIG. 5 is a flowchart showing processing procedures of an embodiment of the present invention.

In FIG. 5, the part enclosed by the dotted line relates to the teaching in the height direction, which has been completed prior to the present embodiment.

Figure 6:
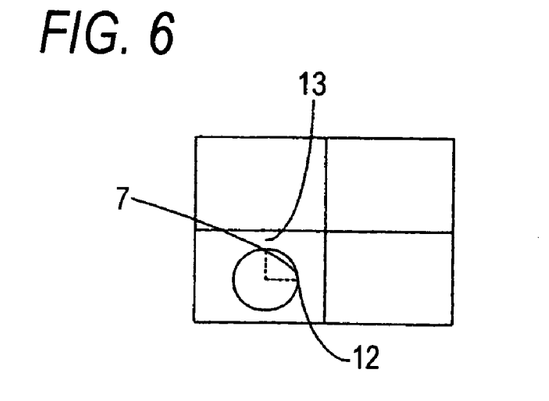
FIG. 6 is a view showing a picture of a positioning mark viewed from a camera.

If the positioning mark 7 is seen in the lower left of a screen when viewed from the camera 4 as in FIG. 6 when the hand 2 was inserted into the processing unit 5 as in FIG. 2, the image processing portion 8 performs an image processing upon an instruction from the teaching control portion 10 and, first, detects the pixel numbers of a deviation dx in the lateral direction (12 in FIG. 6) and a deviation dy in the longitudinal direction (13 in FIG. 6) between the center of the positioning mark 7 and screen center.

Herein, as already mentioned, since the coordinate system of the carrier robot 1 and coordinate system of the camera 4 are coincident in their origins and directions and, furthermore, the ratio indicating to what length one pixel of a camera image corresponds on the surface where the positioning mark exists is already known, these two coordinate systems are in a calibrated condition, and by multiplying dx and dy by ratios between the number of pixels and length, respective shift amounts in the lateral direction and in the longitudinal direction can be obtained.

Namely, where the ratio in the lateral direction is provided as "a" and the ratio in the longitudinal direction is provided as "b," the respective shift amounts X and Y can be obtained in the following manner:

$$X = a \times dx$$

$$Y = b \times dy$$

Herein, the a and b have been retained inside the image processing portion 8 in advance. The image processing portion 8 transmits these vales X and Y back to the teaching control portion 10.

Figure 7:
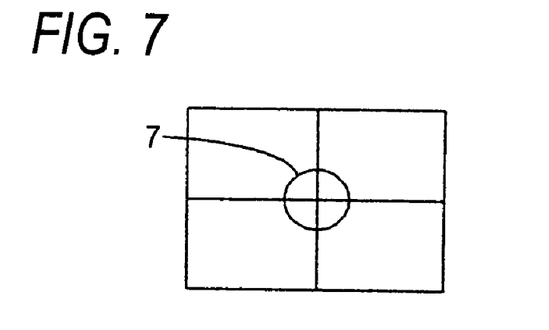
FIG. 7 is a view showing a picture of a positioning mark viewed from a camera.

Based on these values, the teaching control portion 10 transforms the same into motions of the respective axes of the wafer carrier robot 1 and outputs an instruction to the robot controller 9 so as to retract the extensible axis and swivels the pivot counterclockwise so that, as shown in FIG. 7, the positioning mark 7 is seen in the screen center.

Here, in the present embodiment, a picture shot by the camera 4 is outputted to the monitor 11, and an operator can confirm a series of processes of the teaching operation by the monitor 11.

Figure 10:
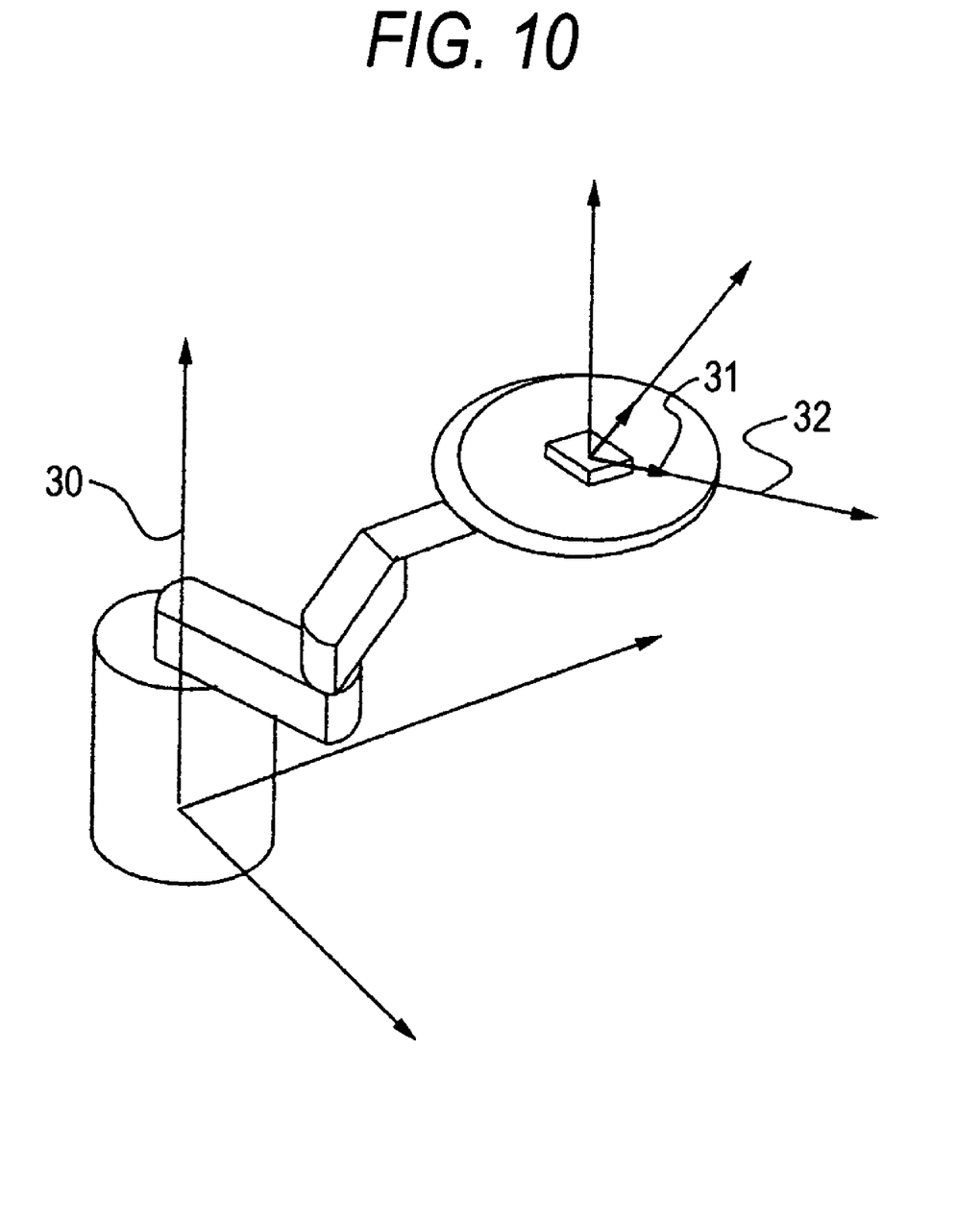
FIG. 10 is an overview diagram of a coordinate system of a second embodiment of the present invention.

Hereinafter, a second embodiment of the present invention will be described on the basis of FIG. 10.

In regard to calibration, although a user coordinate system 32 of the carrier robot 1 and a coordinate system of the camera 4 have been made coincident in their origins and directions, some cases do not have such a positional relationship. The coordinate system 31 of the camera 4 is a coordinate system intrinsic to the camera itself. The user coordinate system 32 having the same origin and coordinate axis directions as those of the coordinate system 31 of the camera 4 is defined. The coordinate system 31 is in pixel units, while the coordinate system 32 is in units identical to those of a coordinate system 30 of the carrier robot 1, for example, 0.001 mm. The coordinate system 32 is defined in the robot controller 9. That is, the relationship between this coordinate system 32 and the coordinate system 30 becomes:

$$F_{30} = F_{32} \cdot M$$

$F_{30}$: Carrier robot coordinate system $F_{32}$: User coordinate system

And, as long as a transformation matrix M is determined in advance, it becomes possible, by transforming a detected position of an image picked up by the camera 4 by use of the transformation matrix M, to calculate the coordinate system 30 of the carrier robot 1 by a simple calculation.

By the above processes, the wafer carrier robot 1 is positioned to an appropriate teaching position in terms of the horizontal direction. In addition, it is also possible that the operator manually performs a teaching operation by adjusting the position of the wafer carrier robot 1 while confirming the picture of the monitor 11 without using the image processing portion 8 and teaching control portion 10.

The teaching jig 3 is removed from the hand 2 after the teaching operation ends. Owing to this construction, the teaching jig 3 can be used in another wafer carrier device, as well.

The present invention as described above provides the following effects.

According to the carrier robot system according to claim 1, teaching becomes possible even when an operator cannot approach a teaching position for conveyance of a wafer or the like.

According to the control method for a carrier robot according to claim 2, teaching can be carried out even when an operator cannot approach a teaching position for conveyance of a wafer or the like, whereby a substantial time reduction and labor savings of a teaching operation can be realized.

According to the control method for a carrier robot according to claim 3, a teaching position of the carrier robot can be obtained by detecting a position of the characteristic part by the image pickup member.

According to the control method for a carrier robot according to claim 4, the jig can be shared by a plurality of carrier robots, whereby maintenance costs can be reduced.

According to the control method for a carrier robot according to claim 5, various targets can be utilized as a characteristic part.

INDUSTRIAL APPLICABILITY

The present invention relates to a carrier robot for carrying out a wafer or the like presenting a low-profile form placed at a predetermined placement position or carrying in a wafer or the like presenting a low-profile form to a predetermined position, and in particular, it is useful as a carrier robot system and a control method for a carrier robot.

[FIG. 1]
A1: Up-and-down direction
A2: Back and forth direction
A3: Rotating direction

[FIG. 4]
4: Camera
1: Carrier robot
9: Robot controller
10: Teaching control portion
8: Image processing portion
11: Monitor

[FIG. 5]
A1: Detecting a height
A2: Determining a teaching position in the height direction
A3: Shifting the height of the carrier robot 1 to the determined position
A4: Teaching in the height direction
A5: Inserting the hand 2 of the carrier robot 1 into the processing unit 5
A6: Detecting pixel numbers of dx and dy
A7: Determining shift amounts X and Y
A8: Transforming into motions of the respective axes of the carrier robot 1
A9: Actuating the respective axes of the carrier robot 1

The invention claimed is:

1. A carrier robot system comprising:
a robot which has a placement portion for placing an object presenting a low-profile form thereon and carries the object;
a robot controller for controlling the robot;
a teaching jig mounted on the placement portion of the robot in place of the object during a teaching operation and having an image pickup member, the teaching jig having a positioning mechanism with respect to the placement portion; wherein the positioning mechanism in the carrier robot system further comprising a hole, a pin, or a letter pattern;
an image processing portion for processing an image picked up by the image pickup member; and
a teaching control portion for controlling the robot controller and image processing portion,
wherein the robot is installed in a semiconductor manufacturing apparatus.

2. A control method for a carrier robot installed in a semiconductor manufacturing apparatus for carrying an object presenting a low-profile shape placed at a predetermined placement position, wherein
the method comprising the steps of:
positioning in a predetermined direction and placing a teaching jig having an image pickup member in advance in place of an object on a placement portion of a front end of an arm of the robot, wherein a positioning mechanism in the teaching jig with respect to the positioning portion is used for the positioning,
shifting the robot to a position where the image pickup member can detect a characteristic part existing in the vicinity of the predetermined placement portion; wherein the characteristic part existing in the vicinity of the predetermined portion is a hole, a pin, or a letter pattern
picking up an image including the characteristic part by the image pickup member,
determining a position of the characteristic part in a coordinate system of the image pickup member based on the picked-up image, and
transforming a position on the coordinate system of the image pickup member into a position on a coordinate system of the robot to determine the placement position.

3. The control method for a carrier robot according to claim 2, wherein
a transformation matrix for transforming a relationship between the coordinate system of the image pickup member and the coordinate system of the robot in translation and rotation is determined in advance, and
the position of the characteristic part in the coordinate system of the image pickup member is transformed into a position in the coordinate system of the robot.

4. The control method for a carrier robot according to claim 2, wherein
the jig is removable from the placement portion during conveyance of the object presenting a low-profile form.

* * * * *